(12) United States Patent
Blomiley et al.

(10) Patent No.: US 7,662,649 B2
(45) Date of Patent: Feb. 16, 2010

(54) METHODS FOR ASSESSING ALIGNMENTS OF SUBSTRATES WITHIN DEPOSITION APPARATUSES; AND METHODS FOR ASSESSING THICKNESSES OF DEPOSITED LAYERS WITHIN DEPOSITION APPARATUSES

(75) Inventors: Eric R. Blomiley, Boise, ID (US); Nirmal Ramaswamy, Boise, ID (US); Ross S. Dando, Nampa, ID (US); Joel A. Drewes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 721 days.

(21) Appl. No.: 11/445,032

(22) Filed: May 31, 2006

(65) Prior Publication Data

US 2006/0216840 A1    Sep. 28, 2006

Related U.S. Application Data

(62) Division of application No. 10/822,060, filed on Apr. 8, 2004.

(51) Int. Cl.
*H01L 21/66* (2006.01)

(52) U.S. Cl. ........................................................ 438/16

(58) Field of Classification Search ........................ None
See application file for complete search history.

(56) References Cited

U.S. PATENT DOCUMENTS

| 3,852,588 A | 12/1974 | Crawford |
| 4,558,660 A | 12/1985 | Nishizawa et al. |
| 4,755,654 A | 7/1988 | Crowley et al. |
| 4,836,138 A | 6/1989 | Robinson et al. |
| 4,858,557 A | 8/1989 | Pozzetti et al. |
| 5,061,872 A | 10/1991 | Kulka |
| 5,228,501 A | 7/1993 | Tepman et al. |
| 5,364,667 A | 11/1994 | Rhieu |
| 5,467,259 A | 11/1995 | Hume et al. |
| 5,551,983 A | 9/1996 | Shepard et al. |
| 5,556,476 A | 9/1996 | Lei et al. |
| 5,673,922 A | 10/1997 | Sherstinsky et al. |
| 5,782,974 A | 7/1998 | Sorensen et al. |
| 5,860,640 A | 1/1999 | Marohl et al. |
| 5,882,419 A | 3/1999 | Sinha et al. |
| 5,898,167 A * | 4/1999 | Musha et al. ............ 250/201.5 |
| 5,944,422 A | 8/1999 | Doitel et al. |
| 6,021,152 A | 2/2000 | Olsen et al. |
| 6,079,426 A | 6/2000 | Subrahmanyam et al. |
| 6,079,874 A | 6/2000 | Hegedus |
| 6,108,490 A | 8/2000 | Lee et al. |

(Continued)

FOREIGN PATENT DOCUMENTS

DE        29713706 U1    11/1997

(Continued)

*Primary Examiner*—Charles D Garber
*Assistant Examiner*—André C Stevenson
(74) *Attorney, Agent, or Firm*—Wells St. John P.S.

(57) ABSTRACT

The invention includes deposition apparatuses having reflectors with rugged reflective surfaces configured to disperse light reflected therefrom, and/or having dispersers between lamps and a substrate. The invention also includes optical methods for utilization within a deposition apparatus for assessing the alignment of a substrate within the apparatus and/or for assessing the thickness of a layer of material deposited within the apparatus.

40 Claims, 7 Drawing Sheets

U.S. PATENT DOCUMENTS

| | | |
|---|---|---|
| 6,186,092 B1 | 2/2001 | Tsai et al. |
| 6,257,045 B1 * | 7/2001 | Hosokawa et al. ........... 73/1.79 |
| 6,333,272 B1 | 12/2001 | McMillin et al. |
| 6,530,994 B1 | 3/2003 | Mahawili |
| 6,890,383 B2 | 5/2005 | Kashino |
| 6,994,769 B2 | 2/2006 | Singh et al. |
| 7,009,919 B2 * | 3/2006 | Matsuda ................. 369/44.41 |
| 7,024,105 B2 | 4/2006 | Fodor et al. |
| 7,070,660 B2 | 7/2006 | Keeton et al. |
| 2001/0010228 A1 | 8/2001 | Au et al. |
| 2001/0037761 A1 | 11/2001 | Ries et al. |
| 2002/0129768 A1 | 9/2002 | Carpenter et al. |
| 2003/0005958 A1 | 1/2003 | Rocha-Alvarez et al. |
| 2003/0006429 A1 * | 1/2003 | Takahashi et al. ........... 257/200 |
| 2003/0168174 A1 | 9/2003 | Foree |
| 2004/0000321 A1 | 1/2004 | Cui et al. |
| 2004/0032581 A1 * | 2/2004 | Nikoonahad et al. ..... 356/237.2 |
| 2005/0016466 A1 | 1/2005 | Scudder et al. |
| 2006/0057826 A1 | 3/2006 | DeBoer |

FOREIGN PATENT DOCUMENTS

| | | |
|---|---|---|
| JP | 10012364 A | 1/1998 |

* cited by examiner

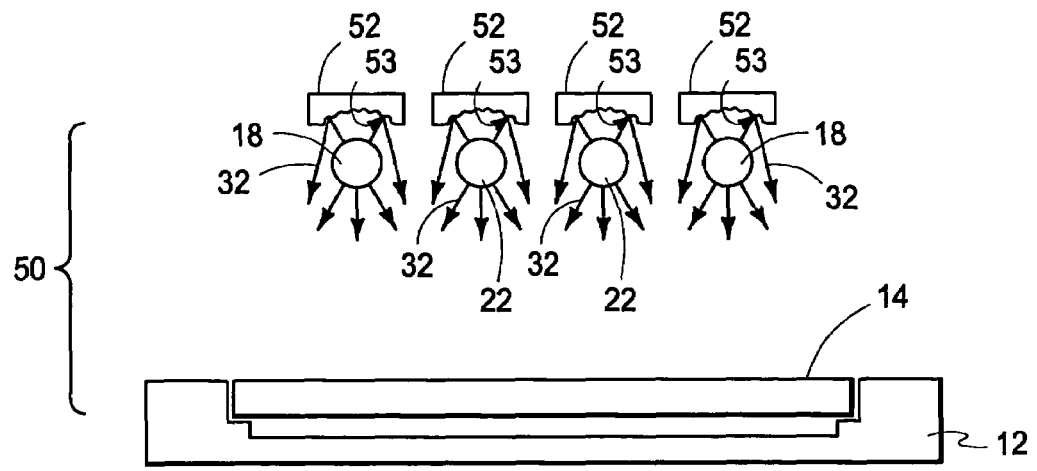
𝐅𝐈𝐆 5
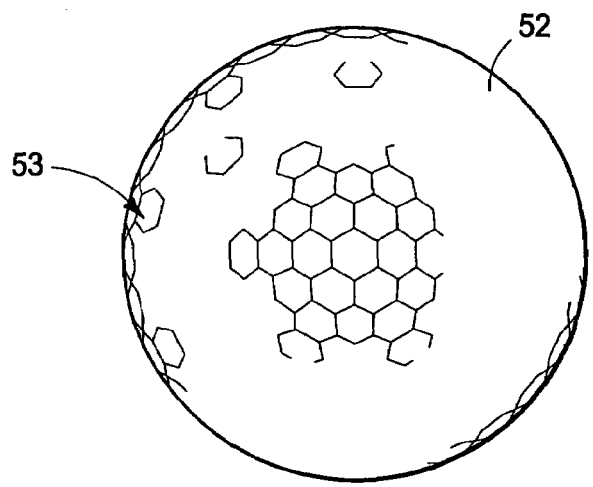
𝐅𝐈𝐆 6
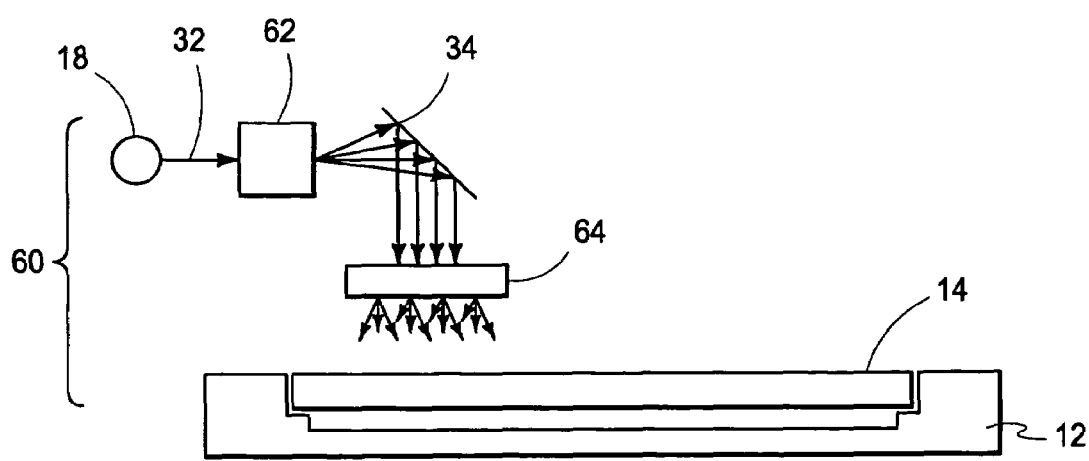
𝐅𝐈𝐆 7

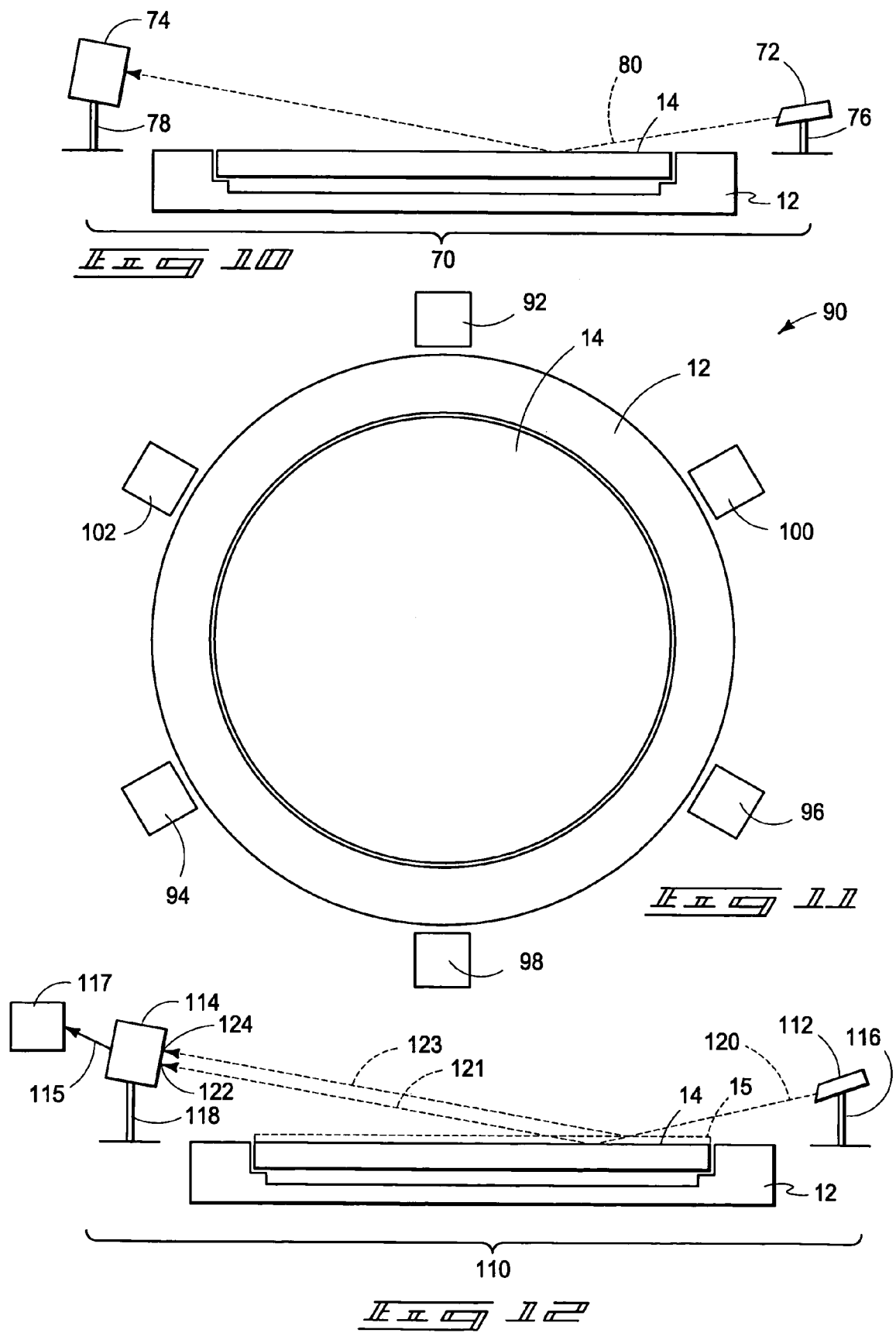

METHODS FOR ASSESSING ALIGNMENTS OF SUBSTRATES WITHIN DEPOSITION APPARATUSES; AND METHODS FOR ASSESSING THICKNESSES OF DEPOSITED LAYERS WITHIN DEPOSITION APPARATUSES

RELATED PATENT DATA

This patent resulted from a divisional of U.S. patent application Ser. No. 10/822,060, filed Apr. 8, 2004, which is hereby incorporated by reference.

TECHNICAL FIELD

The invention pertains to deposition apparatuses, to methods of assessing alignment of substrates within deposition apparatuses, and to methods of assessing thicknesses of deposited layers within deposition apparatuses.

BACKGROUND OF THE INVENTION

Integrated circuitry fabrication includes deposition of materials and layers over semiconductor wafer substrates. One or more substrates are received within a deposition chamber within which deposition typically occurs. One or more precursors or substances are caused to flow to a substrate, typically as a vapor, to effect deposition of a layer over the substrate. A single substrate is typically positioned or supported for deposition by a susceptor. In the context of this document, a "susceptor" is any device which holds or supports at least one wafer within a chamber or environment for deposition. Deposition may occur by chemical vapor deposition, atomic layer deposition and/or by other means.

FIGS. 1 and 2 diagrammatically depict a prior art susceptor 12, and various issues associated therewith. Susceptor 12 receives a semiconductor wafer substrate 14 (shown in dashed-line view in FIG. 2) for deposition. Substrate 14 is received within a pocket or recess 16 of the susceptor to elevationally and laterally retain substrate 14 in the desired position.

A particular exemplary system is a lamp heated, thermal deposition system having front and back side radiant heating of the substrate and susceptor for attaining and maintaining desired temperature during deposition. FIG. 2 depicts a thermal deposition system having at least two radiant heating sources for each side of susceptor 12. Depicted are front side and back side peripheral radiation emitting sources 18 and 20, respectively, and front side and back side radially inner radiation emitting sources 22 and 24, respectively. Incident radiation from sources 18, 20, 22 and 24 overlaps on the susceptor and substrate, creating overlap areas 25. Such can cause an annular region of the substrate corresponding in position to overlap areas 25 to be hotter than other areas of the substrate not so overlapped. Further, the center and periphery of the substrate can be cooler than even the substrate area which is not overlapped due to less than complete or even exposure to the incident radiation.

The susceptor is typically caused to rotate during deposition, with deposition precursor gas flows occurring across the wafer substrate. An $H_2$ gas curtain (not shown) will typically be provided within the chamber proximate a slit valve (not shown) through which the substrate is moved into and out of the chamber. A preheat ring (not shown) is typically received about the susceptor, and provides another heat source which heats the gas flowing within the deposition chamber to the wafer. In spite of the preheat ring, the regions of the substrate proximate where gas flows to the substrate can be cooler than other regions of the substrate.

Robotic arms (not shown) are typically used to position substrate 14 within recess 16. Such positioning of substrate 14 does not always result in the substrate being positioned entirely within susceptor recess 16. Further, gas flow might dislodge the wafer such that it is received both within and without recess 16. Such can further result in temperature variation across the substrate and, regardless, result in less controlled or uniform deposition over substrate 14.

The sources 18, 20, 22 and 24 can be lamps provided directly over surfaces which are to be exposed to radiation, or can be light directed from lamps which are remote from the surface to which radiation is to be directed. Such aspects of the prior art are shown in FIGS. 3 and 4. Specifically, FIG. 3 diagrammatically shows sources 18 and 22 as lamps provided over a surface of the substrate 14 retained within susceptor 12. The lamps 18 and 22 have surfaces closest to substrate 14 from which emitted light is directed toward substrate 14, and have opposing surfaces from which emitted light is directed away from substrate 14. The surfaces near substrate 14 can be considered forward surfaces, and the opposing surfaces can be considered rearward surfaces. A plurality of reflectors 30 can be provided to reflect light emitted from the rearward surfaces of lamps 18 and 22 toward substrate 14. Emitted light is diagrammatically illustrated in FIG. 3 by arrows 32 (only some of which are labeled), and such arrows show light emitted directly toward substrate 14, and also show light reflecting from reflectors 30 toward substrate 14. Reflectors 30 can have the shown curved shapes, or can be substantially flat.

Referring to FIG. 4, a pair of lamps 18 is shown remote from a surface of substrate 14 (the lamps 22 are not shown in FIG. 4 in order to simplify the drawing, and the lamps 20 and 24 are not shown in either of FIGS. 3 and 4, again to simplify the drawings). A pair of mirrors 34 is shown over substrate 14. Light 32 is directed from lamps 18 toward mirrors 34, and then reflected from the mirrors 34 toward substrate 14.

Various problems can exist with the prior art apparatuses described with reference to FIGS. 1-4. For instance, there can be problems with uneven heating across a substrate, as described above, and there can also be problems with the substrate wobbling or otherwise being improperly aligned within the susceptor. Additionally, there can be problems in obtaining uniform deposition of materials across the substrate, in ascertaining if the deposition across the substrate is uniform, and in ascertaining the approximate thickness of the deposition across the substrate. It is desired to develop improved susceptor apparatus designs and methodologies for utilizing susceptor apparatuses which address one or more of such problems. However, although the invention was motivated from this perspective and in conjunction with the above-described reactor and susceptor designs, the invention is not so limited. Rather, the invention is only limited by the accompanying claims as literally worded, without interpretive or other limiting reference to the specification and drawings, and in accordance with the doctrine of equivalents.

SUMMARY OF THE INVENTION

In one aspect, the invention includes a deposition apparatus. The apparatus comprises a substrate susceptor for receiving a substrate and one or more lamps for providing radiant energy to the substrate. Further, the apparatus includes a reflector associated with at least one of the lamps and configured for directing radiant energy from the lamp toward the substrate. The reflector has a rugged reflective surface configured to disperse the light reflected therefrom.

In one aspect, the invention encompasses a deposition apparatus which includes a disperser between a lamp and a substrate. The apparatus is configured such that at least some light waves emitted from the lamp are passed through the disperser and then utilized for providing radiant energy to the substrate.

In one aspect, the invention encompasses a method of assessing alignment of a substrate within a deposition apparatus. A deposition apparatus is provided to have a substrate susceptor for receiving a substrate, to have one or more laser emitters, and to have one or more photodetectors. A substrate is provided to be received by the susceptor. Light is emitted from at least one of the laser emitters toward the substrate and reflected from the substrate to at least one of the photodetectors. The emitted light is detected with the photodetector, and information pertaining to the detected light is utilized to assess alignment of the substrate.

In one aspect, the invention encompasses a method for assessing the thickness of a deposited layer utilizing optical methods for determining a thickness of a material over a surface of a susceptor. The optical methods can include, for example, ellipsometry.

In one aspect, the invention includes a method of assessing the thickness of a deposited layer within a deposition apparatus. The apparatus includes one or more laser emitters and one or more photodetectors. The apparatus also includes a susceptor. A substrate is provided to be received by the susceptor, and the layer is deposited onto the substrate. Light is emitted from at least one of the laser emitters toward the substrate and reflected from the substrate to at least one of the photodetectors. The reflected light is detected by the photodetector and information pertaining to the detected light is utilized to assess the thickness of the deposited layer.

BRIEF DESCRIPTION OF THE DRAWINGS

Preferred embodiments of the invention are described below with reference to the following accompanying drawings.

FIG. 5 is a diagrammatic, cross-sectional view of a deposition apparatus encompassing an aspect of the present invention.

FIG. 6 is a diagrammatic top view of a reflector suitable for utilization in an exemplary aspect of the present invention.

FIG. 7 is a diagrammatic, cross-sectional view of a portion of a deposition apparatus comprising an aspect of the present invention.

FIG. 10 is a diagrammatic, cross-sectional view of a portion of a deposition apparatus comprising an aspect of the present invention.

FIG. 11 is a top view of a portion of a deposition apparatus comprising an aspect of the present invention.

FIG. 12 is a diagrammatic, cross-sectional view of a deposition apparatus comprising an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
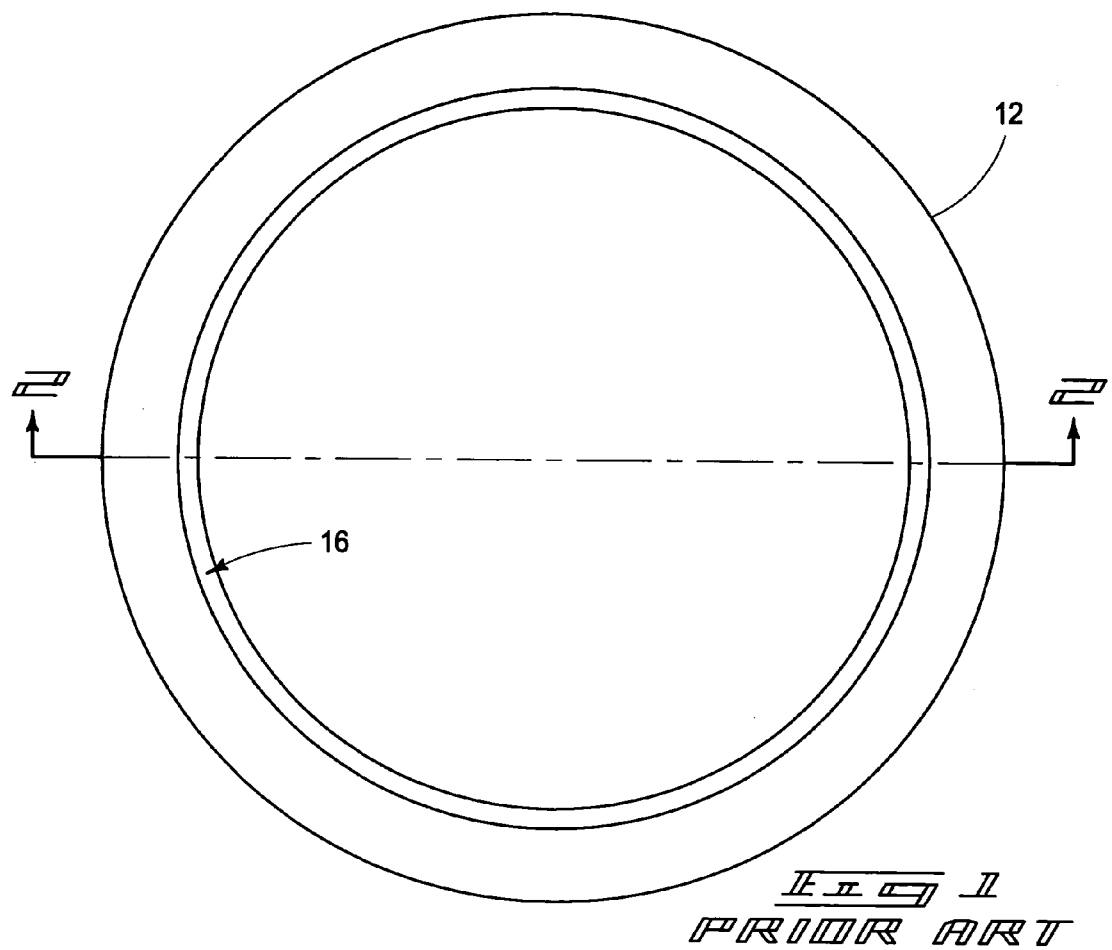
FIG. 1 is a top view of a prior art susceptor.
Figure 2:
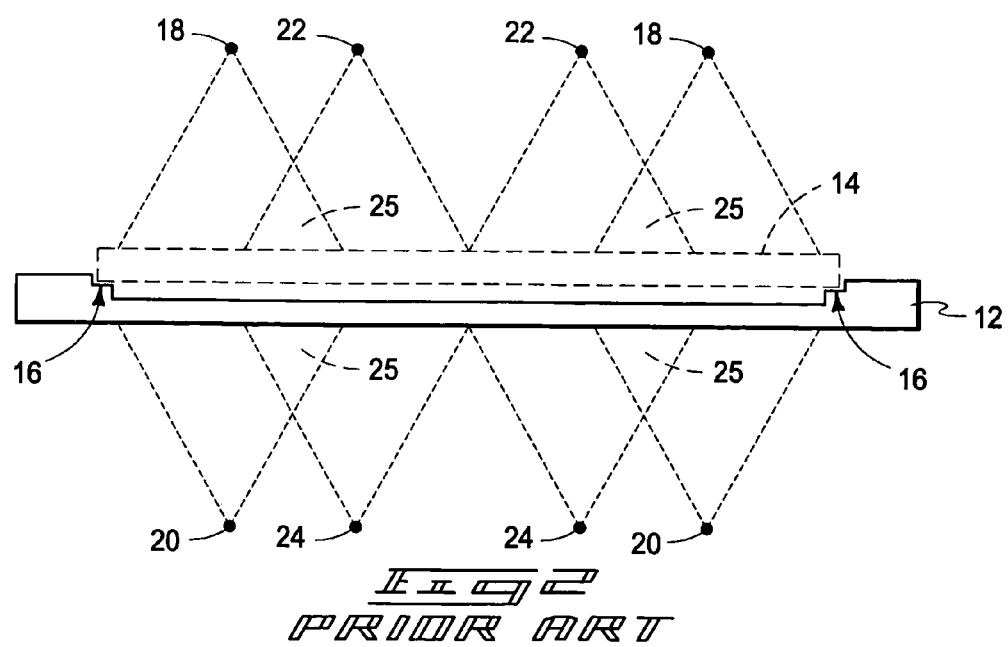
FIG. 2 is a cross-section of the FIG. 1 susceptor taken through the line 2-2 of FIG. 1.

FIG. 2 of the "Background" section of this disclosure shows an arrangement utilized for heating a semiconductor wafer during a deposition process. The construction of FIG. 2 is typical of constructions utilized for selective epitaxial growth of silicon or silicon/germanium, and can also be utilized for other deposition processes, including other processes in which silicon or other semiconductor materials are grown. The substrate 14 of FIG. 2 is divided into regions which are heated from upper and lower banks of lamps. The regions can be divided into inner and outer zones, as described in the "Background" section of this disclosure.

The upper bank of lamps of the FIG. 2 apparatus will heat the wafer primarily through radiant heating, and the lamps will typically be directly over the wafer. The lower zone of the wafer of FIG. 2 will be also heated with radiant heating, but typically not directly from the lamps since the wafer sits on an opaque wafer platform (the susceptor 12) which has only edge contact with the wafer.

A problem with the configuration of FIG. 2 is that overlap regions (regions 25 of FIG. 2) will typically endure more intense heating than other regions, which can lead to a donut/annulus of higher temperature material associated with portions of the wafer exposed to the overlap regions. One aspect of the present invention is a recognition that diffusion of the radiant energy from the lamps can be advantageous. Specifically, diffusion of the radiant energy can spread the hot spots associated with overlap regions over wider areas, which can ultimately lead to better temperature uniformity than is achieved with prior art apparatuses. The radiant energy is light, with term "light" being used herein to refer to any suitable electromagnetic radiation. Accordingly, the term "light" can include, but is not limited to, light in the visible wavelengths.

Figure 3:
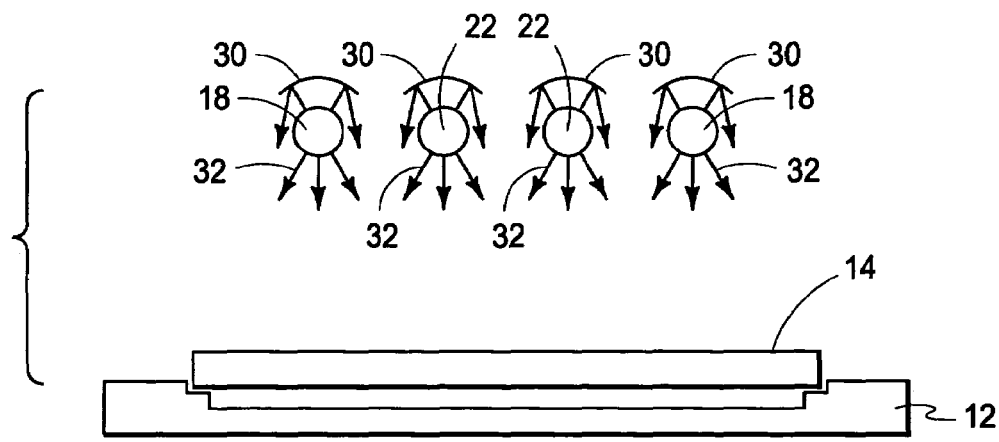
FIG. 3 is a diagrammatic, cross-sectional view of a portion of a prior art deposition apparatus illustrating an exemplary lamp arrangement.

FIG. 5 illustrates one method which can be utilized for increasing diffusion of light from lamps 18 and 22. Specifically, FIG. 5 shows a portion of an apparatus 50 comprising the susceptor 12 and substrate 14 described previously in the "Background" section of this disclosure, and further comprising the lamps 18 and 22 (the apparatus 50 could further comprise the light sources 20 and 24, but such light sources are not shown in the diagram of FIG. 5 in order to simplify the drawing). Each of the lamps 18 and 22 has a reflector 52 associated therewith. The reflectors have rugged surfaces 53 which disperse light more than the prior art smooth surfaces associated with reflectors 30 (FIG. 3) of the prior art. The reflected light is shown by arrows 32 (only some of which are labeled) in FIG. 5. Although four lamps are shown, it is to be understood that more than four or less than four lamps can be utilized. Also, although each of the lamps is shown associated with a reflector having the rugged surface 53, it is to be understood that the invention encompasses aspects in which less than all of the lamps are associated with the shown reflectors. Although FIG. 5 shows the reflectors associated only with a top bank of lamps, it is to be understood that the reflectors could additionally, or alternatively, be associated with one or more lamps of the bottom bank (the lamps 20 and 24 of FIG. 2).

The rugged reflective surface 53 can comprise any suitable structure. In some aspects, the rugged reflective surface will comprise a repeating pattern, such as, for example, a repeating honeycomb pattern or a repeating pattern of dimples. In other aspects, the reflective surface can comprise a relatively random structure, such as, for example, a crinkled foil structure. FIG. 6 shows a top view of a reflector. The illustrated top view is toward the reflector 53, which corresponds to a bottom view in the structure of FIG. 5, but which would typically be referred to as a top view in the art. The reflector 52 of FIG. 6 comprises a rugged surface 53 corresponding to a repeating honeycomb pattern. Such repeating pattern is but one of many suitable repeating patterns, and can be an example of a repeating dimpled pattern. The repeating honeycomb pattern would typical be across a substantial entirety (or a total entirety) of a rugged portion of the surface of the FIG. 6 reflector utilized for reflecting radiation toward the substrate, and is shown broken up in FIG. 6 to convey a sense that the FIG. 6 reflector is concavely-curved.

Figure 4:
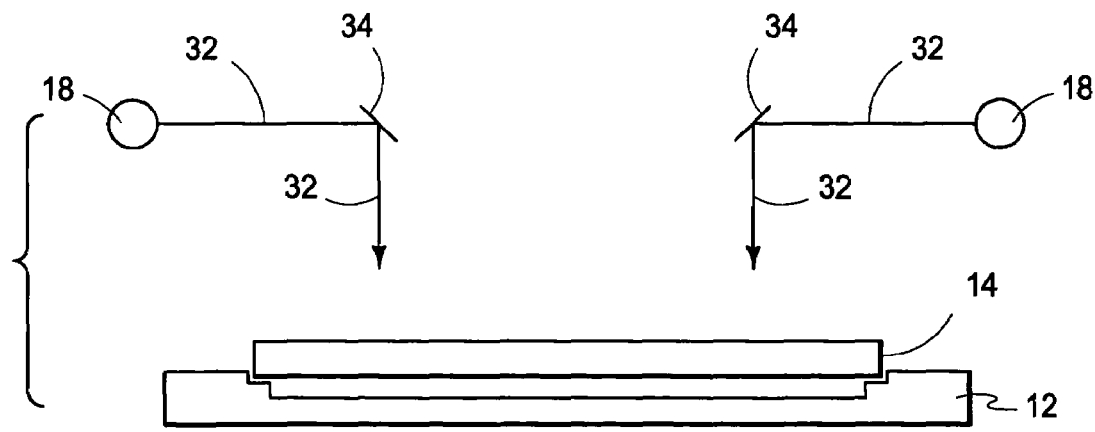
FIG. 4 is a diagrammatic, cross-sectional view of a portion of a prior art deposition apparatus having an alternative lamp arrangement relative to the FIG. 3 apparatus.

FIG. 7 illustrates another aspect of the invention which can be utilized for diffusing radiation. Specifically, FIG. 7 illustrates an apparatus 60 comprising the susceptor 12 and substrate 14 described previously, and comprising a top bank of lamps in which the lamps 18 are remote from wafer 14 rather than directly over the wafer. The lamps 22 are not shown in the diagram of FIG. 7 in order to simplify the drawing, but it is to be understood that lamps 22 can also be remote from the surface 14 similarly to the lamps 18, or can be directly over the surface 14 even though the lamps 18 are remote. Radiation 32 (i.e. light waves) is directed from lamps 18 toward a mirror 34 of the type described previously relative to FIG. 4, and thereafter is directed toward a surface of substrate 14. However, in contrast to the prior art structure of FIG. 4, radiation 32 passes through a first disperser 62 prior to mirror 34, and then passes through a second disperser 64 after mirror 34. Accordingly, the radiation 32 is split into multiple units, or in other words is dispersed prior to reaching the surface of substrate 14.

The first and second dispersers 62 and 64 can comprise any suitable units which can disperse light waves, including, for example, diffraction gratings.

Although two dispersers are utilized in the shown aspect of the invention, it is to be understood that more than two dispersers can be utilized, or only one disperser can be utilized. Also, although the dispersers are shown on both sides of mirror 34, it is to be understood that the invention encompasses other aspects in which dispersers are only provided upstream of mirror 34, or only provided downstream of mirror 34, rather than being both upstream and downstream of the mirror along the light path. Additionally, the invention encompasses aspects in which the dispersers are utilized without also utilizing a mirror.

The dispersers of FIG. 7 can be combined with the reflectors of FIG. 5 in some aspects of the invention. For instance, the reflectors of FIG. 5 can be utilized with the upper bank of lamps (lamps 18 and 22 of FIG. 2), and the dispersers of FIG. 7 can be utilized with the lower bank of lamps (the lamps 20 and 24 of FIG. 2). Alternatively, or additionally, both the reflectors and dispersers can be utilized with a single lamp so that light is reflected off of a rugged reflector surface and then directed through a disperser as the light is directed toward substrate 14.

The lamps 18 and 22 of FIGS. 5 and 7 can be either within a reaction chamber associated with a deposition apparatus or external to the reaction chamber. If the lamps are external of the reaction chamber relative to the aspect of FIG. 7, the dispersers can be either within the reaction chamber, or external to the reaction chamber, or some of the dispersers can be within the reaction chamber while others are external to the reaction chamber.

Figure 8:
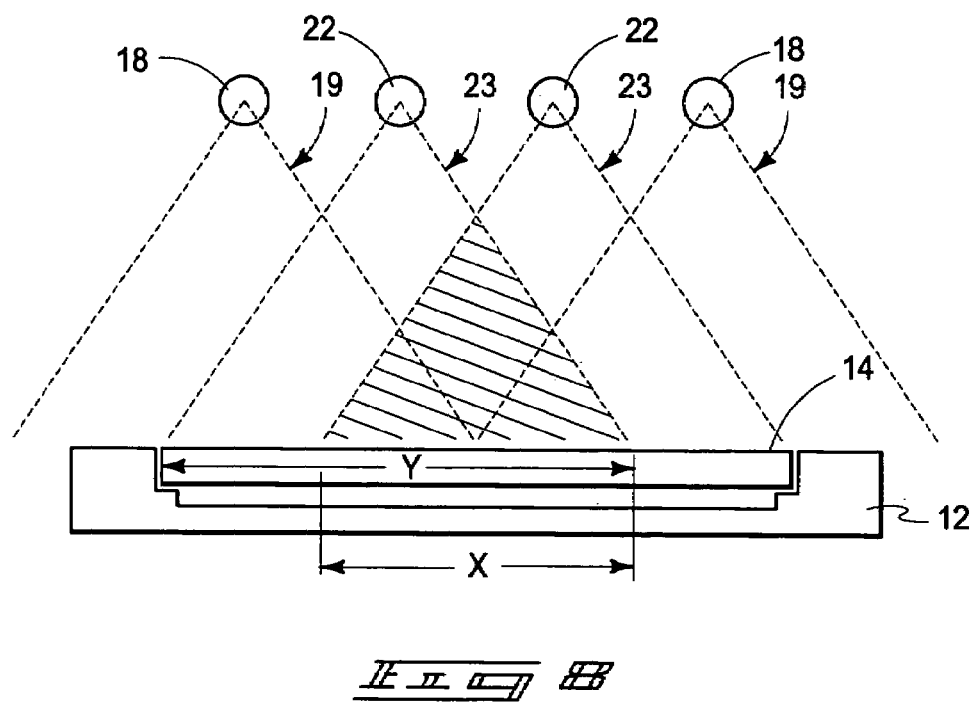
FIG. 8 is a diagrammatic, cross-sectional view of a portion of a deposition apparatus illustrating overlap of light from adjacent lamps on a substrate.

FIG. 8 shows an apparatus of the present invention in a view similar to that utilized in FIG. 2 for showing a prior art apparatus, but only shows the top bank of radiant energy sources (18 and 22) even though both banks would typically be utilized in the aspect of FIG. 8. The radiant energy from the sources 18 is labeled as 19 in FIG. 8, and the radiant energy from sources 22 is labeled as 23 in FIG. 8. The radiant energy from sources 18 and 22 is shown to be much more disperse in the aspect of FIG. 8 than in the prior art aspect. Accordingly, there is overlap over substantially entirely all of the substrate 14 which can significantly reduce, and even eliminate, the problematic hot spots existing within prior art apparatuses. An amount of overlap between the pair of adjacent inner light sources 22 is cross-hatched in FIG. 8, and shown as a length "X" across the top of wafer 14. The length "X" is at least about 50% of the total length of light from the source 22 impacting substrate 14, with such total length being shown as the length "Y" in FIG. 8. In particular aspects of the invention, the amount of overlap can be at least 50%, and in some aspects greater than 70%, and in yet other aspects greater than 90% of the total length impacting a surface of substrate 14.

Figure 9:
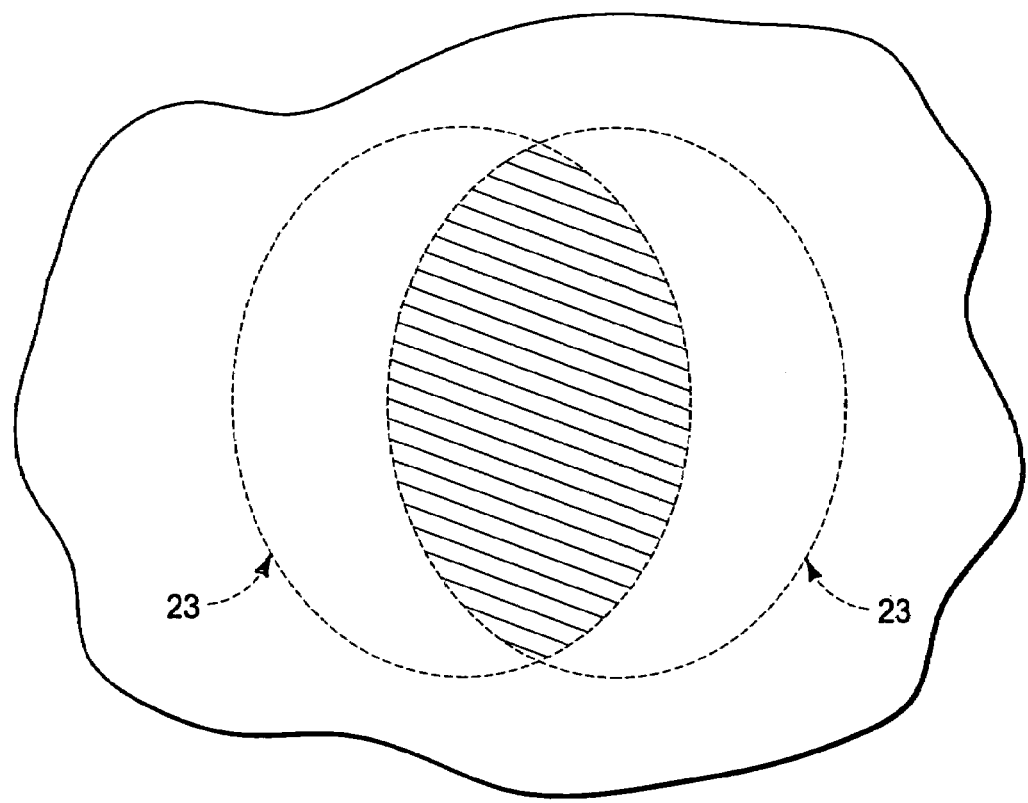
FIG. 9 is a fragmentary top view of a portion of the substrate of FIG. 8 further illustrating the overlap of light from adjacent lamps.

It is noted that the cross-sectional view of FIG. 8 shows the light from source 22 impacting substrate 14 as a length, but that in a three-dimensional view the light from source 22 would actually be a cone and would impact surface 14 in a circular or elliptical shape. FIG. 9 shows a top view of a fragment of the FIG. 8 structure, and shows elliptical light beams 23 overlapping. The overlap of the light beams can be quantitated as the amount of surface area of substrate 14 which is impacted by one light beam and also impacted by the adjacent light beam, relative to the amount of area impacted by the one light beam and not by the adjacent light beam. In some aspects of the invention, at least 50% of the radiant energy impacting the substrate from one lamp is overlapped by radiant energy impacting the substrate from an adjacent lamp. The amount of overlap in particular aspects can be greater than 60%, greater than 70%, greater than 80%, or even greater than 90%.

Another aspect of the invention pertains to methodology for assessing alignment of a substrate within a deposition apparatus. Such aspect is described with reference to FIGS. 10 and 11. Referring initially to FIG. 10, an apparatus 70 comprises the susceptor 12 and substrate 14 described previously. The apparatus further comprises a light source (or emitter) 72 and a light detector 74. The source 72 is mounted through a support 76 to apparatus 70 at a location proximate susceptor 12, and the detector 74 is mounted through a support 78 to apparatus 70 at a location which is also proximate susceptor 12. The susceptor can be within a reaction chamber, and one or both of the source 72 and detector 74 can be within the chamber, or alternatively one or both of the source 72 and detector 74 can be external to the chamber.

Source 72 can be any suitable source of light, and in particular aspects will be a laser emitter. Detector 74 can be any suitable detector, and in particular aspects will be a photodetector configured to detect reflected laser light. Any suitable number of emitters and detectors can be utilized, with the emitters and detectors typically provided in paired configurations so that each emitter is in one-to-one correspondence with a detector.

In operation, emitter 72 emits light toward a surface of substrate 14, with such light being diagrammatically illustrated by dashed line 80. The light reflects off from the substrate toward detector 74. The detector then detects the light, and information about the detected light is utilized to assess alignment of the substrate. In some aspects of the invention, the detector can be in data communication with a signal processor (not shown). Information about the detected light is sent from the detector to the signal processor as a data signal (which can be, for example, an electrical signal), and the data processor processes the information to assess the alignment of the substrate. The information can include the intensity of the light and/or the location of the light. If the substrate is wobbling or otherwise misaligned within susceptor 12, the light detected by the detector will be different than if the substrate is stable and properly aligned within susceptor 12. The detection of misalignment can be enhanced if reflection points from the wafer surface are near a periphery of the wafer than near the center, as offsets from misalignment tend to be more exaggerated at the wafer periphery than at the wafer center. If misalignment is detected, the signal processor can be configured to make adjustments which automatically correct for the misalignment, to trigger an alarm alerting an operator to the misalignment, and/or to shutdown the deposition apparatus. Thus, the misalignment assessment of the present invention can be utilized for process monitoring and/or for automatic process control.

The alignment assessment of FIG. 10 can be particularly useful for application to epitaxial growth of semiconductor materials, such as, for example, epitaxial growth of silicon, including procedures which selectively epitaxially deposit silicon on particular surfaces relative to others. It is found that misalignment or improper leveling of the substrate by 0.005 inches can result in non-uniform films. Prior art methodologies utilized a level to check alignment of wafers, but such is difficult to accomplish in small chambers, and even when the chambers are large enough, it is difficult to obtain the desired accuracy with a level. Further, it is difficult to employ a level for checking alignment of a spinning substrate. Methodology of the present invention can be utilized to assess alignment of a wafer continuously from an initial period before spinning starts, through the spinning of the wafer, and until a period after the spinning of the substrate has stopped. Alignment in accordance with particular aspects of the present invention can advantageously be conducted with greater precision, better reproducibility/accuracy and better wafer-to-wafer uniformity than prior art methods.

In some aspects, two to four pairs of laser emitters and detectors are mounted around a susceptor. Susceptor adjustments are made while the susceptor is stationary (not spinning) until all of the laser beams reflect onto corresponding detectors to achieve maximum signals by the detectors (i.e., the detectors and laser emitters are configured so that maximum signals are received by the detectors when the wafer is properly aligned). The susceptor/wafer combination is then spun, and the alignment is fine-tuned by making further adjustments to maximize the signals detected by the detectors. In particular aspects, the signals received by the detectors can be considered to be approximately maximized during an alignment process, rather than entirely maximized, with the term "approximately maximized" indicating that the signals are brought to within desired tolerances of a maximum signal.

FIG. 11 shows a top view of a construction 90 that can be utilized in an exemplary aspect of the invention. Construction 90 comprises laser emitters 92, 94 and 96, which are paired with photodetectors 98, 100 and 102, respectively. The laser emitters and detectors are arranged around a susceptor 12 having a substrate 14 retained thereby. The shown configuration has three pairs of laser emitters/detectors. It is to be understood, however, that the invention encompasses aspects in which less than three pairs of laser emitters/detectors are utilized or more than three pairs of laser emitters/detectors are utilized.

The above-described process of utilizing light for detection of alignment can be considered an optical method of alignment assessment (with the term "optical method" referring to a method utilizing light, which may or may not be visible-wavelength light). In some aspects of the invention, optical methods can be utilized for assessing the thickness of a deposited layer in addition to, or alternatively to, assessing alignment of a wafer within a deposition apparatus. FIG. 12 shows an apparatus 110 comprising a light source 112 and a light detector 114, and configured for assessing the thickness of a deposited layer. Source 112 can comprise, for example, a laser emitter, and detector 114 can comprise, for example, a photodetector. Emitter 112 is attached to apparatus 110 with a support structure 116, and detector 114 is attached to apparatus 110 with a support structure 118. Emitter 112 and detector 114 can be the same as the emitter 72 and detector 74 described above with reference to the aspect of FIG. 10, or can be different.

The emitter 112 and detector 114 are shown proximate a susceptor 12 and substrate 14. In practice, susceptor 12 and substrate 14 would be within a reaction chamber. One or both of emitter 112 and detector 114 can be within the reaction chamber, or alternatively one or both of emitter 112 and detector 114 can be external of the reaction chamber. If an emitter and/or detector is external of the reaction chamber, the light passing between the emitter and detector can be passed through one or more windows formed in sidewalls of the reaction chamber.

Light emitted from emitter 112 is labeled as shown in dashed line in the diagram of FIG. 12, and labeled 120. Initially, light is emitted from emitter 112 toward an upper surface of substrate 14 and then detected by detector 114. The detected light is utilized to establish a base signal which can be correlated with a starting elevational level of the surface of substrate 14. Specifically, the light reflecting from the surface 14 follows a path 121 and impacts a first location 122 of a face of detector 114. The location 122 of the impact point of path 121 can be considered a termination point of an emitted signal, in some aspects of the invention.

Detector 114 can be in data communication with a signal processor 117, as shown. Information about detected light is sent from the detector to the signal processor as a data signal 115 (which can be, for example, an electrical signal), and the data processor processes the information to assess the thickness of a deposited material. Accordingly, the signal processor can process a data signal from the detector to recognize that light impact location 122 of the detector face corresponds to zero growth of deposited material. Such can be referred to as calibration of the signal processor.

After the signal processor is calibrated, a material 15 is deposited over the surface of substrate 14 (material 15 is shown in dash-line view in FIG. 12). Light from emitter 112 is directed toward substrate 14, but now impacts a surface of deposited material 15, and thus the reflected light takes a new path 123. The light along path 123 impacts a face of detector 114 at a location 124 displaced from location 122. The shift of the termination point of emitted signal 120 from location 122 to location 124 can be ascertained by signal processor 117 and correlated to a thickness of the layer 15 being deposited. In some aspects, the signal processor, can be configured to detect when a desired thickness of layer 15 is deposited and to initiate an automated response. Thus, the film thickness measurement of the present invention can be utilized for process monitoring and/or for automatic process control. In particular aspects of the invention, the thickness monitoring can be utilized as an automatic process control trigger for step-end control.

Although the process of FIG. 12 shows only one emitter and one detector, it is to be understood that a process of the present invention can utilize more than one emitter and/or more than one detector.

Utilization of laser emitters or other light emitters to assess alignment and/or thickness of deposited layers can be advantageous in that the emitters can be utilized in situ during a deposition process to monitor the process. Further, the utilization of the emitters can be conducted without adversely impacting process time, temperature or gas flow in a reaction chamber. Measurement during film growth can enable film growth and uniformity to be correlated with properties of a wafer after the processing (and, in some aspects, after cooling) and/or with performance of devices formed over the wafer. The light utilized in the various aspects of the invention for assessing growth and/or alignment (e.g., the light 80 of FIG. 10 and the light 120 of FIG. 12) can be any suitable wavelength, and typically will be a wavelength which does not alter materials associated with a surface of substrate 14 or deposited over the surface of substrate 14.

FIGS. 13-17 illustrate further methodology by which optical methods can be utilized for assessing the thickness of a deposited layer within a deposition apparatus. In such aspects, growth of material over a susceptor surface is measured and utilized to estimate growth of the same material over a surface of a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 13:
FIG. 13 is a diagrammatic, cross-sectional view of a susceptor at a preliminary processing stage of an aspect of the present invention.

Referring initially to FIG. 13, a susceptor 12 is illustrated at a preliminary processing stage. Susceptor 12 comprises the recess 16 described previously, a trough 130 beneath the recess, and uppermost outer surfaces 132 outwardly adjacent of the recess.

A first material 134 is deposited over the outermost surfaces 132. First material 134 forms a layer over which subsequent deposition can occur. Specifically, in processing described below a material will be deposited over a semiconductor substrate and over the surfaces 132 of susceptor 12. It can be desired that the deposition of the material occur at approximately the same rate over surfaces 132 as over a surface of the substrate. Material 134 can be considered a treatment of surfaces 132 which enhances deposition over the surfaces 132. For instance, susceptor 12 can comprise silicon carbide at surfaces 132 and such silicon carbide can be relatively porous such that deposition over the silicon carbide will occur at a different rate than deposition over a semiconductor wafer substrate. Material 134 can be provided over the silicon carbide surface 132 to provide a new upper surface (surface 136) upon which deposition will occur at approximately the same rate as the deposition over a semiconductor material wafer retained by susceptor 12.

Another application for utilizing layer 134 occurs in aspects in which the deposition occurring over a semiconductor material wafer is selective for a material other than the composition of upper surface 132. Accordingly, material 134 is provided to provide a new upper surface 136 for which the deposition is not selective, and accordingly upon which the deposition will occur. In exemplary applications, a semiconductor material is to be epitaxially grown, and surface 132 comprises silicon dioxide. The epitaxial growth may be selective for material other than silicon dioxide, and accordingly it is advantageous to form the material 134 over surface 132, with material 134 being silicon, germanium or silicon/germanium so that epitaxial growth of semiconductor material readily occurs over material 134.

Although material 134 is shown in the aspect of FIG. 13, it is to be understood that material 134 is optional and can be omitted in other aspects of the invention. For instance, if surface 132 has a suitable composition so that deposition of a material over surface 132 will occur during deposition of the material over a semiconductor wafer substrate, and will occur at a desired rate, then it may be suitable to omit material 134.

Material 134 can comprise any suitable material or combination of materials. For instance, material 134 can, in particular aspects, comprise, consist essentially of, or consist of doped or undoped silicon, germanium or silicon/germanium.

Material 134 is shown formed only over surface 132, rather than over surfaces of recess 16 or trough 130. This can be accomplished by appropriate masking of surfaces of recess 16 and trough 130 during formation of material 134. In some aspects of the invention (not shown) material 134 can be formed over surface 132, and additionally can be formed over surfaces of one or both of recess 16 and trough 130.

Figure 14:
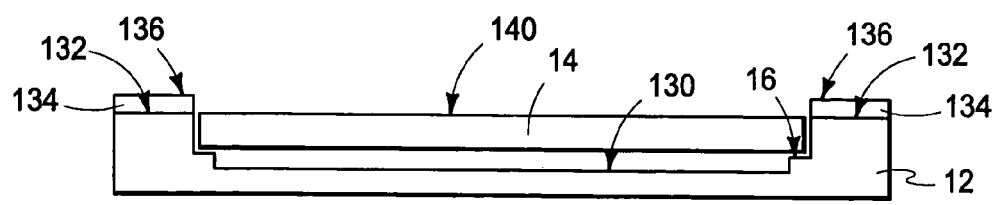
FIG. 14 is a view of the FIG. 13 susceptor having a substrate provided therein, and shown at a processing stage subsequent to that of FIG. 13.

Referring to FIG. 14, the semiconductor wafer substrate 14 is provided within recess 16. Substrate 14 has an upper surface 140. Substrate 14 covers a first portion of the susceptor (for example, covers the trough portion 130 of the susceptor) and leaves a second portion not covered (for example, the surfaces 132 are not covered by the substrate 14).

Figure 15:
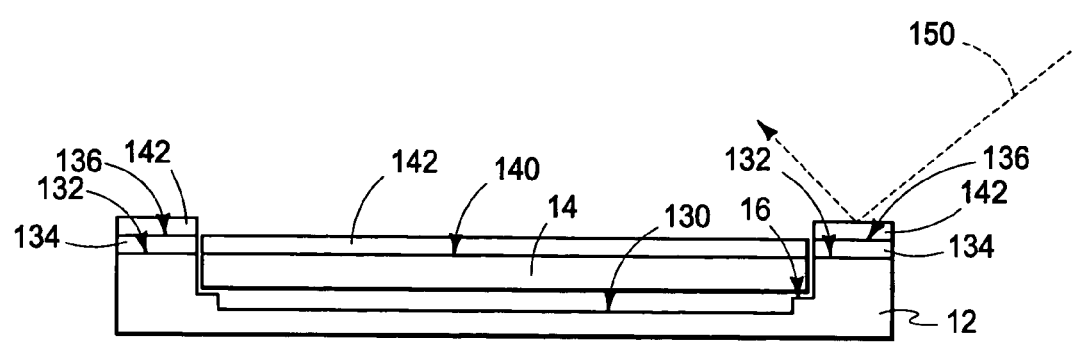
FIG. 15 is a view of the FIG. 13 susceptor having the substrate provided therein, and is shown at a processing stage subsequent to that of FIG. 14.

Referring to FIG. 15, a material 142 is deposited over surface 136 of material 134, and also over surface 140 of semiconductor wafer substrate 14. Materials 134 and 142 can be referred to as first and second materials, respectively, and can be compositionally the same as one another or can be compositionally different from one another. Material 142 can comprise any suitable material, including, for example, materials comprising, consisting essentially of, or consisting of one or both of silicon and germanium. In some aspects, material 142 will be epitaxially grown silicon which is selectively grown over semiconductive material surfaces, such as, for example, surfaces comprising silicon or germanium. In such aspects, it can be desired that material 134 comprise, consist essentially of, or consist of silicon and/or germanium.

The thickness of material 142 over surface 132 (specifically, the thickness of material 142 over layer 134 in the aspect of FIG. 15) is measured by an optical method. Light is represented by the dashed line 150, and such light is associated with the optical method utilized to measure the thickness of material 142 over surface 132.

The optical method utilized can be a method of the type described with reference to FIG. 12, and accordingly can utilize a laser emitter and a photodetector. Alternatively, the optical method can comprise ellipsometry. If ellipsometry is utilized, elliptically polarized light will be directed toward layer 142 and a thickness of the layer will be estimated from one or more of a change in the elliptical polarization, a change in intensity, or a shift in the detected location of the reflected light. Regardless of the optical method utilized, such method will typically comprise emitting light from one or more emitters toward susceptor surface 132 such that at least some of the light passes into or through the material 142 formed over the susceptor surface. The emitted light can then be detected with one or more photodetectors, and information about the detected light can be utilized to assess the thickness of the deposited material 142 on the susceptor surface. The utilization of the information can incorporate a signal processor similar to the processor 117 described above with reference to FIG. 12.

The thickness of material 142 on the susceptor surface can be correlated with the thickness of the material over surface 140 of the semiconductor wafer substrate. Thus, a thickness and/or rate of growth of material 140 on substrate 14 can be estimated from measurements of the material 140 that is over surface 132.

The emitters and photodetectors utilized for the methodology of FIG. 15 can be either within a reaction chamber comprising susceptor 12 and substrate 14, or can be external to such reaction chamber. If an emitter and/or detector is external of the reaction chamber, the light 150 can be passed through one or more windows formed in sidewalls of the reaction chamber.

Figure 16:
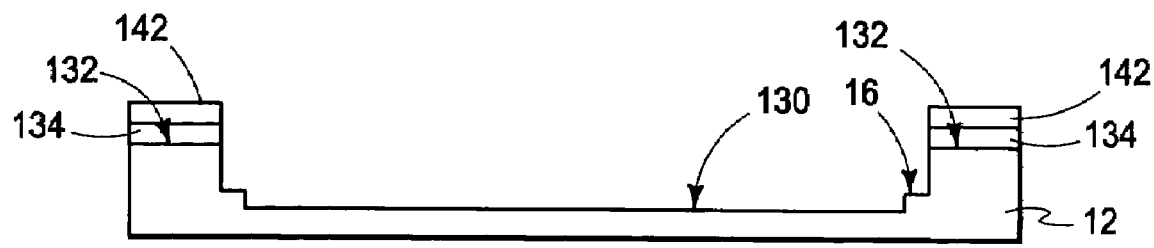
FIG. 16 is a view of the FIG. 13 susceptor shown at a processing stage subsequent to that of FIG. 15.

Referring to FIG. 16, wafer 14 is removed from susceptor 12.

Figure 17:
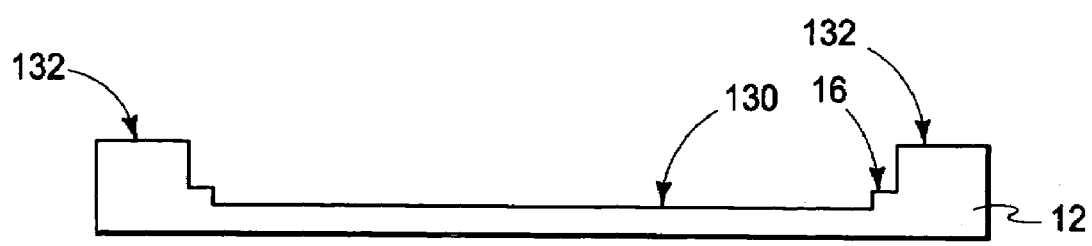
FIG. 17 is a view of the FIG. 13 susceptor shown at a processing stage subsequent to that of FIG. 16.

Referring to FIG. 17, materials 134 and 142 are removed from over surface 132. The processing of FIGS. 13-15 can then be repeated with a second semiconductor substrate. Although both of materials 142 and 134 are shown removed at the processing stage of FIG. 17, it is to be understood that only material 142 can be removed in some aspects of the invention, and material 134 can remain during processing with a second semiconductor wafer. It is also to be understood that both materials 134 and 142 can be left over surface 132 in some aspects of the invention, and the processing repeated with a second semiconductor wafer, with the new deposited material being deposited over both a surface of the semiconductor material and over an outer surface of material 142.

The removal of materials 142 and 134 can be conducted with, for example, hydrochloric acid, in aspects in which materials 134 and 142 comprise, consist essentially of, or consist of silicon, germanium, or silicon/germanium.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of assessing alignment of semiconductor wafer substrate within a deposition apparatus, comprising:
   providing a deposition apparatus having a substrate susceptor for receiving a semiconductor wafer substrate, having one or more laser emitters configured to reflect laser light from the substrate, and having one or more photodetectors configured to detect the reflected laser light;
   providing a semiconductor wafer substrate received by the susceptor;
   emitting light from at least one of the laser emitters toward the substrate such that at least some of the light reflects from the substrate to at least one of the photodetectors;
   detecting the emitted light with said at least one of the photodetectors;
   utilizing information about the detected light to assess alignment of the substrate;
   using the information about the detected light to make susceptor adjustments to improve the alignment;
   wherein the utilization of the information and improving of alignment comprises making susceptor adjustments until an approximately maximum signal is received by the photodetector; and
   wherein two or more of the laser emitters are utilized together with two or more of the photodetectors, wherein each of the laser emitters is paired with one of the photodetectors, and wherein the utilization of the information and improving of alignment comprises making susceptor adjustments until approximately maximum signals are received by all of the photodetectors.

2. A method of assessing alignment of semiconductor wafer substrate within a deposition apparatus, comprising:
   providing a deposition apparatus having a substrate susceptor for receiving a semiconductor wafer substrate, having one or more laser emitters configured to reflect laser light from the substrate, and having one or more photodetectors configured to detect the reflected laser light;
   providing a semiconductor wafer substrate received by the susceptor;
   emitting light from at least one of the laser emitters toward the substrate such that at least some of the light reflects from the substrate to at least one of the photodetectors;
   detecting the emitted light with said at least one of the photodetectors;
   utilizing information about the detected light to assess alignment of the substrate; and
   wherein the susceptor is utilized to spin the substrate, and wherein the emitting of the light and the detecting the emitted light is conducted while the substrate is spinning.

3. A method of assessing the thickness of a deposited layer within a deposition apparatus, comprising:
   providing a deposition apparatus having a substrate susceptor for receiving a semiconductor wafer substrate, having one or more laser emitters configured to reflect laser light from the substrate, and having one or more photodetectors configured to detect the reflected laser light;
   providing a semiconductor wafer substrate received by the susceptor;
   depositing a layer onto the substrate while utilizing the susceptor to spin the substrate;
   emitting light from at least one of the laser emitters toward the substrate, while the substrate is spinning, such that at least some of the light reflects from the substrate to at least one of the photodetectors;

detecting the emitted light with said at least one of the photodetectors; and utilizing information about the detected light to assess the thickness of the deposited layer on the substrate as the substrate is spinning.

4. The method of claim 3 wherein the information utilized to assess the thickness of the deposited layer on the substrate includes a location of the detection of the emitted light on the detector.

5. The method of claim 3 wherein the susceptor is within a reaction chamber, and wherein said at least one of the laser emitters and at least one of the photodetectors are also within the reaction chamber.

6. The method of claim 3 wherein the susceptor is within a reaction chamber, and wherein said at least one of the laser emitters and at least one of the photodetectors are not within the reaction chamber.

7. A method of assessing the thickness of a deposited layer within a deposition apparatus, comprising:
providing a deposition apparatus having a substrate susceptor for receiving a semiconductor wafer substrate;
providing a semiconductor wafer substrate received by the susceptor, the substrate covering a first portion of the susceptor and leaving a second portion of the susceptor not covered;
while the susceptor and substrate are spinning, depositing a material onto the substrate and over the second portion of the susceptor; and
optically determining a thickness of the material over the second portion of the susceptor as the substrate and susceptor are spinning.

8. A method of assessing the thickness of a deposited layer within a deposition apparatus, comprising:
providing a deposition apparatus having a substrate susceptor for receiving a semiconductor wafer substrate;
providing a semiconductor wafer substrate received by the susceptor, the substrate covering a first portion of the susceptor and leaving a second portion of the susceptor not covered;
depositing a material onto the substrate and over the second portion of the susceptor;
optically determining a thickness of the material over the second portion of the susceptor; and
estimating the thickness of the deposited material over the substrate utilizing the assessed thickness of the deposited material over the second portion of the susceptor.

9. The method of claim 7 wherein the deposited material comprises silicon.

10. The method of claim 7 wherein the deposited material consists essentially of silicon.

11. The method of claim 7 wherein the deposited material consists of silicon.

12. The method of claim 7 wherein the deposited material comprises silicon/germanium.

13. The method of claim 7 wherein the deposited material consists essentially of silicon/germanium.

14. The method of claim 7 wherein the deposited material consists of silicon/germanium.

15. The method of claim 7 wherein the optically determining utilizes ellipsometry.

16. The method of claim 7 further comprising, prior to providing the substrate to be received by the susceptor, treating the susceptor to enhance deposition of the material over the second portion of the susceptor.

17. The method of claim 16 wherein the deposited material is a second material, and wherein the treating comprises depositing a first material over the second portion of the susceptor.

18. The method of claim 17 wherein the first and second materials both comprise silicon.

19. The method of claim 17 wherein the first and second materials are the same composition as one another.

20. The method of claim 17 wherein the substrate is a first substrate and is removed from over the susceptor after the second material is deposited onto the first substrate, the method further comprising providing a second substrate onto the susceptor, and, prior to providing the second substrate, removing the second material from over the second portion of the susceptor.

21. A method of assessing the thickness of a deposited layer within a deposition apparatus, comprising:
providing a deposition apparatus having a substrate susceptor for receiving a semiconductor wafer substrate;
providing a semiconductor wafer substrate received by the susceptor, the substrate covering a first portion of the susceptor and leaving a second portion of the susceptor not covered;
depositing a material onto the substrate and over the second portion of the susceptor;
optically determining a thickness of the material over the second portion of the susceptor;
prior to providing the substrate to be received by the susceptor, treating the susceptor to enhance deposition of the material over the second portion of the susceptor;
wherein the deposited material is a second material, the treating comprises depositing a first material over the second portion of the susceptor, and the substrate is a first substrate and is removed from over the susceptor after the second material is deposited onto the first substrate;
providing a second substrate onto the susceptor, and, prior to providing the second substrate:
removing the first and second materials from the second portion of the susceptor; and
after removing the first and second materials, re-depositing first material onto the second portion of the susceptor.

22. A method of assessing the thickness of a deposited layer within a deposition apparatus, comprising:
providing a deposition apparatus having a substrate susceptor for receiving a semiconductor wafer substrate, having one or more emitters configured to emit light toward a surface of the susceptor, and having one or more detectors configured to detect the emitted light;
providing a semiconductor wafer substrate received by the susceptor, the substrate covering a portion of the susceptor and leaving a surface of the susceptor not covered;
while the susceptor and substrate are spinning, depositing a material onto the substrate and over the surface of the susceptor;
as the susceptor and substrate are spinning, emitting light from at least one of the emitters toward the susceptor surface such that at least some of the light passes onto or through the material over the susceptor surface and then proceeds to at least one of the detectors;
detecting the emitted light with said at least one of the photodetectors, as the susceptor and substrate are spinning; and
utilizing information about the detected light to assess the thickness of the deposited material over the susceptor surface, as the susceptor and substrate are spinning.

23. A method of assessing the thickness of a deposited layer within a deposition apparatus, comprising:
  providing a deposition apparatus having a substrate susceptor for receiving a semiconductor wafer substrate, having one or more emitters configured to emit light toward a surface of the susceptor, and having one or more detectors configured to detect the emitted light;
  providing a semiconductor wafer substrate received by the susceptor, the substrate covering a portion of the susceptor and leaving a surface of the susceptor not covered;
  depositing a material onto the substrate and over the surface of the susceptor;
  emitting light from at least one of the emitters toward the susceptor surface such that at least some of the light passes onto or through the material over the susceptor surface and then proceeds to at least one of the detectors;
  detecting the emitted light with said at least one of the photodetectors;
  utilizing information about the detected light to assess the thickness of the deposited material over the susceptor surface; and
  estimating the thickness of the deposited material over the substrate utilizing the assessed thickness of the deposited material over the susceptor surface.

24. The method of claim 22 wherein the deposited material comprises silicon.

25. The method of claim 22 wherein the deposited material consists essentially of silicon.

26. The method of claim 22 wherein the deposited material consists of silicon.

27. The method of claim 22 wherein the deposited material comprises silicon/germanium.

28. The method of claim 22 wherein the deposited material consists essentially of silicon/germanium.

29. The method of claim 22 wherein the deposited material consists of silicon/germanium.

30. The method of claim 22 wherein the detected light is elliptically polarized light.

31. The method of claim 22 wherein the susceptor is within a reaction chamber, and wherein said at least one of the emitters and at least one of the detectors are also within the reaction chamber.

32. The method of claim 22 wherein the susceptor is within a reaction chamber, and wherein said at least one of the emitters and at least one of the detectors are not within the reaction chamber.

33. A method of assessing the thickness of a deposited layer within a deposition apparatus, comprising:
  providing a deposition apparatus having a substrate susceptor for receiving a semiconductor wafer substrate, having one or more emitters configured to emit light toward a surface of the susceptor, and having one or more detectors configured to detect the emitted light;
  providing a semiconductor wafer substrate received by the susceptor, the substrate covering a portion of the susceptor and leaving a surface of the susceptor not covered;
  depositing a material onto the substrate and over the surface of the susceptor;
  emitting light from at least one of the emitters toward the susceptor surface such that at least some of the light passes onto or through the material over the susceptor surface and then proceeds to at least one of the detectors;
  detecting the emitted light with said at least one of the photodetectors;
  utilizing information about the detected light to assess the thickness of the deposited material over the susceptor surface; and
  prior to providing the substrate onto the susceptor, treating the susceptor to enhance deposition of the material over the surface of the susceptor.

34. The method of claim 33 wherein the deposited material is a second material, and wherein the treating comprises depositing a first material over the surface of the susceptor.

35. The method of claim 34 wherein the first and second materials both comprise silicon.

36. The method of claim 34 wherein the first and second materials are the same as one another.

37. The method of claim 34 wherein the substrate is a first substrate and is removed from over the susceptor after the second material is deposited onto the first substrate, the method further comprising providing a second substrate onto the susceptor, and, prior to providing the second substrate, removing the second material from over the susceptor surface.

38. The method of claim 34 wherein the substrate is a first substrate and is removed from over the susceptor after the second material is deposited onto the first substrate, the method further comprising providing a second substrate onto the susceptor, and, prior to providing the second substrate:
  removing the first and second materials from over the susceptor surface; and
  after removing the first and second materials, re-depositing first material onto the susceptor surface.

39. The method of claim 23 wherein the deposited material comprises epitaxially grown silicon.

40. The method of claim 23 wherein the deposited material comprises epitaxially grown germanium.

* * * * *

UNITED STATES PATENT AND TRADEMARK OFFICE
CERTIFICATE OF CORRECTION

PATENT NO. : 7,662,649 B2
APPLICATION NO. : 11/445032
DATED : February 16, 2010
INVENTOR(S) : Eric R. Blomiley et al.

It is certified that error appears in the above-identified patent and that said Letters Patent is hereby corrected as shown below:

In column 12, line 49, in Claim 2, after "detecting" insert -- of --.

Signed and Sealed this

Eighteenth Day of May, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,662,649 B2 | Page 1 of 1 |
| APPLICATION NO. | : 11/445032 | |
| DATED | : February 16, 2010 | |
| INVENTOR(S) | : Blomiley et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 931 days.

Signed and Sealed this

Thirtieth Day of November, 2010

David J. Kappos
*Director of the United States Patent and Trademark Office*